(12) United States Patent
Lee et al.

(10) Patent No.: US 7,754,610 B2
(45) Date of Patent: Jul. 13, 2010

(54) PROCESS FOR ETCHING TUNGSTEN SILICIDE OVERLYING POLYSILICON PARTICULARLY IN A FLASH MEMORY

(75) Inventors: Kyeong-Tae Lee, San Jose, CA (US); Jinhan Choi, San Ramon, CA (US); Bi Jang, Yongin (KR); Shashank C. Deshmukh, San Jose, CA (US); Meihua Shen, Fremont, CA (US); Thorsten B. Lill, Santa Clara, CA (US); Jae Bum Yu, Suwon (KR)

(73) Assignee: Applied Materials, Inc., Santa Clara, CA (US)

( * ) Notice: Subject to any disclaimer, the term of this patent is extended or adjusted under 35 U.S.C. 154(b) by 481 days.

(21) Appl. No.: 11/445,709

(22) Filed: Jun. 2, 2006

(65) Prior Publication Data

US 2007/0281477 A1 Dec. 6, 2007

(51) Int. Cl.
*H01L 21/302* (2006.01)
*C23F 1/00* (2006.01)

(52) U.S. Cl. ............ 438/689; 216/67; 257/E21.209; 257/E21.311; 257/E21.312

(58) Field of Classification Search .......... 216/68, 216/71, 75, 79; 438/719, 721, 734
See application file for complete search history.

(56) References Cited

U.S. PATENT DOCUMENTS

| 4,992,136 | A | | 2/1991 | Tachi et al. | 156/643 |
|---|---|---|---|---|---|
| 5,259,923 | A | * | 11/1993 | Hori et al. | 216/66 |
| 6,081,334 | A | * | 6/2000 | Grimbergen et al. | 356/499 |
| 6,136,211 | A | * | 10/2000 | Qian et al. | 216/37 |
| 6,406,924 | B1 | * | 6/2002 | Grimbergen et al. | 438/9 |
| 6,423,644 | B1 | * | 7/2002 | Nallan et al. | 438/714 |
| 6,440,870 | B1 | * | 8/2002 | Nallan et al. | 438/734 |
| 6,579,806 | B2 | * | 6/2003 | Nallan et al. | 438/720 |
| 6,673,685 | B2 | * | 1/2004 | Mori et al. | 438/302 |
| 6,699,399 | B1 | * | 3/2004 | Qian et al. | 216/67 |
| 6,872,322 | B1 | * | 3/2005 | Chow et al. | 216/67 |
| 7,147,740 | B2 | * | 12/2006 | Takayama et al. | 156/235 |
| 7,413,992 | B2 | * | 8/2008 | Tan et al. | 438/706 |
| 2002/0028582 | A1 | * | 3/2002 | Nallan et al. | 438/710 |
| 2003/0003757 | A1 | * | 1/2003 | Nallan et al. | 438/710 |
| 2003/0049876 | A1 | * | 3/2003 | Mori et al. | 438/23 |
| 2003/0148622 | A1 | * | 8/2003 | Shen et al. | 438/709 |
| 2003/0217805 | A1 | * | 11/2003 | Takayama et al. | 156/249 |
| 2004/0038436 | A1 | * | 2/2004 | Mori et al. | 438/17 |

(Continued)

FOREIGN PATENT DOCUMENTS

JP 2-145783 6/1990

(Continued)

*Primary Examiner*—Allan Olsen
(74) *Attorney, Agent, or Firm*—Law Offices of Charles Guenzer

(57) ABSTRACT

A method of plasma etching tungsten silicide over polysilicon particularly useful in fabricating flash memory having both a densely packed area and an open (iso) area requiring a long over etch due to microloading. Wafer biasing is decreased in the over etch. The principal etchant include $NF_3$ and $Cl_2$. Argon is added to prevent undercutting at the dense/iso interface. Oxygen and nitrogen oxidize any exposed silicon to increase etch selectivity and straightens the etch profile. $SiCl_4$ may be added for additional selectivity.

35 Claims, 3 Drawing Sheets

U.S. PATENT DOCUMENTS

| | | | |
|---|---|---|---|
| 2005/0064714 A1* | 3/2005 | Mui et al. | 438/706 |
| 2006/0273072 A1* | 12/2006 | Tan et al. | 216/67 |
| 2007/0243352 A1* | 10/2007 | Takayama et al. | 428/40.1 |
| 2009/0321004 A1* | 12/2009 | Takayama et al. | 156/249 |

FOREIGN PATENT DOCUMENTS

| | | | |
|---|---|---|---|
| JP | 02-145783 | * | 6/1990 |
| JP | 5-251401 | | 9/1993 |
| JP | 05-251401 | * | 9/1993 |
| JP | 2004-273532 | * | 9/2004 |

* cited by examiner

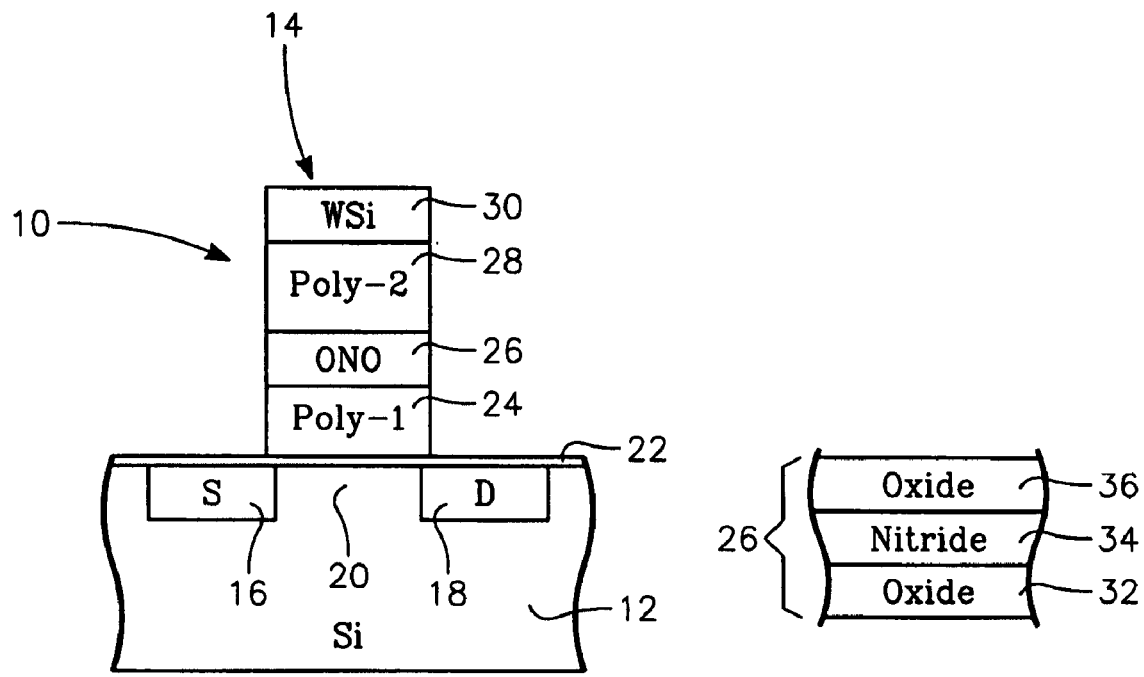
FIG. 1
FIG. 2
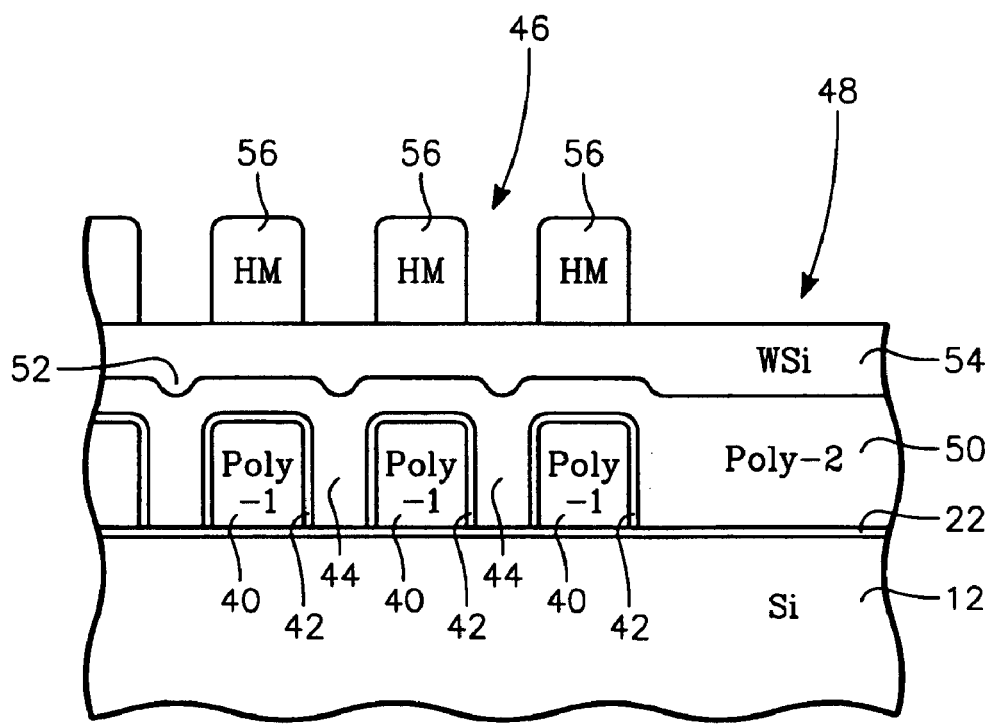
FIG. 3

US 7,754,610 B2

PROCESS FOR ETCHING TUNGSTEN SILICIDE OVERLYING POLYSILICON PARTICULARLY IN A FLASH MEMORY

FIELD OF THE INVENTION

The invention relates generally to plasma etching. In particular, the invention relates to etching tungsten and other tungsten-containing materials over silicon.

BACKGROUND ART

Flash memory has assumed an increasingly important position in semiconductor memory technology. It provides relatively fast non-volatile rewritable memory, which is particularly attractive in mobile applications such as cell phones, portable music players, and other devices which rely upon battery power but are often turned off for extended periods. Nonetheless, flash memory chips are being economically fabricated which have a capacity of greater than a gigabit.

However, large-capacity flash memories of the desired characteristics have been accomplished by aggressively reducing the area of the memory cells, by reducing the thickness of many of the important layers, and by relying upon cells having a distinctively three-dimensional structure. The shrinkage has introduced severe requirements upon the etching process used to form the memory cell, especially the etching of the tungsten-based contact on the polysilicon control gate.

One type of floating memory cell 10 is illustrated in the cross-sectional view of FIG. 1. The cell is one of many formed over a crystalline silicon substrate 12. A cell stack 14 is formed over an area of the substrate 12 between a doped source region 16 and a similarly doped drain region 18 with a well region 20 of the opposite conductivity type under the stack 14. A thin gate oxide layer 22 overlies the substrate 12. The stack 14 is formed over the gate oxide layer 22 by depositing as initially unpatterned planar layers a first doped polysilicon layer 24, a coupling layer 26, usually referred to as the ONO (oxide-nitride-oxide) layer, as will be explained shortly, a second doped polysilicon layer 28, and a contact layer 30.

The ONO layer 26, illustrated in more detail in FIG. 2, constitutes the core of the storage element and includes a lower oxide layer 32 of silicon oxide approximately of the composition $SiO_2$, an intermediate nitride layer 34 of silicon nitride approximately of the composition $Si_3N_4$, and an upper oxide layer 34 similarly of silicon oxide. The ONO layers 32, 34, 36 are very thin, typically in the range of 10 to 20 nm. The memory storage mechanism involves injecting electronic charge across one of the oxide layers 32, 36 into the nitride layer 34, where it is trapped and affects the voltage applied to the well region 20, hence affecting the conductivity between the source and drain regions 16, 18. The reading mechanism senses the current and hence the conductivity between the source and drain regions 16, 18 and hence the charge stored in the nitride layer 34. Whether charge has been injected into the nitride layer 34 determines the memory state of the flash memory cell 10.

The contact layer 30 is usually based on tungsten. Currently, tungsten silicide (WSi) is the most prevalent contact material, but other tungsten-based contact compositions are contemplated, for example, a multi-layer W/WN contact. Electrical contact to the upper end of the stack 14 is established through the contact layer 30.

A large number of such stacks 14 are simultaneously formed by further depositing a relatively thick nitride hard mask layer over the contact layer 30 and then applying a photoresist layer, which is photographically patterned. The hard mask layer is etched through the patterned photoresist and is then used as a robust hard mask to anisotropically etch at least part of the stack 14. After completion of etching, the hard mask is removed.

A more realistic structure of one embodiment of a flash memory array midway through formation is illustrated in the cross-sectional view of FIG. 3. In this embodiment, the first polysilicon layer 24 is first patterned into narrow ridge-shaped polysilicon cells 40 extending perpendicularly to the plane of the illustration. The ridges are covered with a thin conformal ONO layer 42, which may cover the top of the gate oxide layer 22 as well. In the interest of increased memory density, gaps or holes 44 between the cells 40 are made relatively small, for example, 40 nm. As illustrated, the structure is divided into a dense area 46 in which the cells 40 are tightly packed and an isolated (usually called iso) area 48 in which the first polysilicon layer has been removed and there are no cells 40.

A second polysilicon layer 50 is deposited to fill the gaps 44 and cover the cells 40 sufficiently to provide a gating structure. However, because of the narrow and deep gaps 44, troughs 52 form in the upper surface of the second polysilicon layer 50 overlying the gaps 44. A tungsten silicide layer 54 acting as a contact layer is deposited over the second polysilicon layer 50. Because of the need to reduce the thickness of the contact layer 54, the depth of the troughs 52 may be significant to the thickness of the planar portions of the contact overlayer 54. Thereafter, the nitride hard mask layer is deposited and photolithographically patterned into a patterned hard mask 56.

The etching of the tungsten-based contact layer 54, particularly when it is composed of WSi, has presented increasing difficulties as the lateral and vertical dimension shrink with increasingly large flash memories.

SUMMARY OF THE INVENTION

The invention includes plasma etching a tungsten-containing contact overlying a polysilicon layer. Tungsten silicide is the preferred tungsten-containing material but tungsten or tungsten nitride may be substituted. Although not so limited, the invention is particularly useful in forming a flash memory circuit requiring a long over etch because of microloading introduced by the difference between densely packed memory cells and open (iso) areas. As a result, a long over etch is performed.

The principal etchant for the tungsten is gas containing both chlorine and fluorine, for example, $NF_3$ and $Cl_2$. Low wafer biasing, for example, less than one-third that of the source power, reduces depth microloading.

Addition of an oxidizing gas, for example, both oxygen and nitrogen, increases selectivity to silicon.

Addition of argon or helium, particularly in the main etch, reduces the residence time for etch byproducts and prevents undercutting of the tungsten material.

Decreasing the $NF_3/Cl_2$ ratio in the over etch improves selectivity and reduces undercutting.

Silicon tetrachloride may be added for a further increase in selectivity.

BRIEF DESCRIPTION OF THE DRAWINGS

FIG. 1 is a schematic cross-sectional view of a flash memory cell.

FIG. 2 is a cross-sectional view of the ONO memory storage layer of the flash memory cell of FIG. 1.

FIG. 3 is a cross-sectional view of part of one embodiment of an array of flash memory cells at a point during its fabrication.

DETAILED DESCRIPTION OF THE PREFERRED EMBODIMENTS

Figure 4:
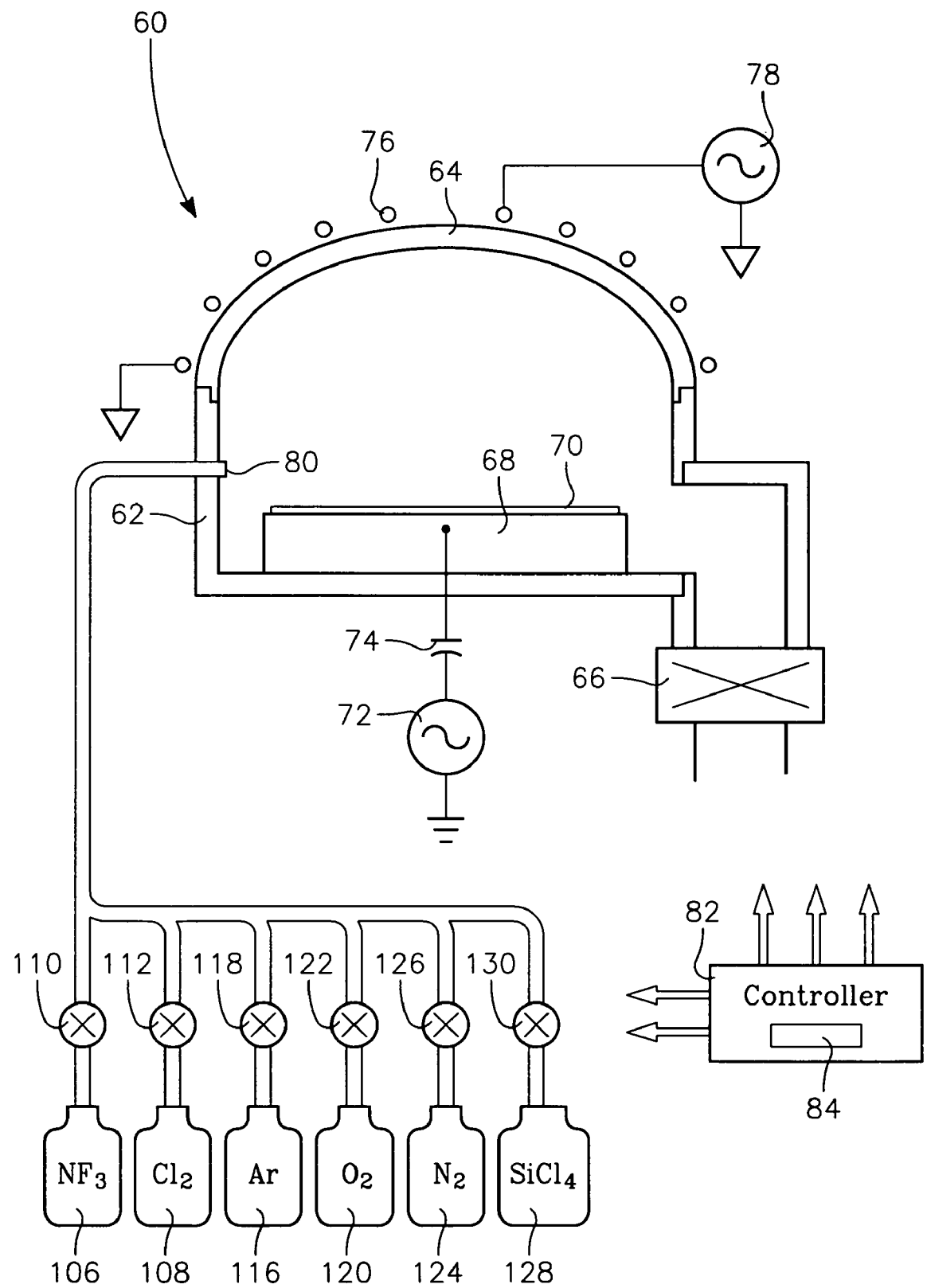
FIG. 4 is a cross-sectional view of a plasma etch reactor usable with the invention.

With reference to FIG. 3, we have observed several difficulties in etching the WSi layer 54 through the hard mask 56. In advanced designs, the thicknesses of all the layers need to minimized to reduce the overall size of the memory cell so there is little margin for errors and non-uniformity in etching depths. The depths of the troughs 52 have been observed to beup to 70% of the thickness of the WSi layer 54 in more planar areas. Accordingly, once a main etch (ME) has etched through the WSi layer 54 in the planar areas, a long over etch (OE) is required to clear out the WSi residue from the troughs 52. The over etch may extend for 75 to 100% of the time of the main etch. The long over etch requires good selectivity of the WSi etch to silicon in the second polysilicon layer 50. The etching profiles need to be maintained as vertical as possible, both in the WSi layer 54 and in the portion of the polysilicon consumed in the overetch. The distinction between the dense and iso area 46, 48 produces the effect of microloading in which the iso area 48 is etched more quickly than the dense area 46 because of the protected geometry of the gaps developing in the WSi layer 54 in the dense area 46 versus the open planar structure in the iso area 48. Also, the interface between the dense and iso areas 46, 48 produce distinctive etch structures, which need to be controlled.

The invention has been developed on the DPS II etch reactor available from Applied Materials, Inc. of Santa Clara, Calif., but the invention is not limited to this reactor and may be applied to other plasma etch reactors differing to lesser or greater extent from that illustrated. A plasma etch reactor 60 illustrated in the cross-sectional view of FIG. 4 includes an inductively powered decoupled plasma source of the sort implemented on the DPS II etch reactor. The reactor 60 includes a vacuum chamber having a metal main chamber 62 generally disposed about a central axis and a dielectric dome 64 sealed to the main chamber 62. A vacuum pump 66 selectively pumps the vacuum chamber to the low milliTorr range. A pedestal electrode 68 supports a wafer 70 or other substrate centered on the central axis in opposition to the dome 64. An RF power supply 72 is connected to the pedestal electrode 68 through a capacitive coupling circuit 74 to apply a bias power $W_B$ to the wafer 70 and the plasma processing it. One or more inductive coils 76 are spirally wrapped around the outside of the dielectric dome 64 and are selectively powered by another RF power supply 78 to inductively coupled RF source power $W_S$ into the vacuum chamber and excite the processing gas supplied into the vacuum chamber through one or more gas injectors 80 into a plasma. A computerized controller 82 controls the operation of the different electrically controllable elements of the reactor 60 according to a process recipe recorded on a recordable medium 84, such as a floppy disk or CDROM, inserted into the controller 82.

The source power $W_S$ from the inductive coil 76 is primarily responsible for exciting the plasma and determining the density of the plasma at a location distant from the wafer 70. The bias power $W_B$, from the pedestal electrode 68 is uniformly distributed over the wafer 70. Although it has some effect on generating the plasma, it primarily creates a negative self-bias voltage at the edge of the plasma adjacent the wafer 70. The negative voltage accelerates positive ions in the plasma of the processing gas towards the wafer 70 with two effects. First, the trajectories of the ions become sharply directed along the normal of the wafer 70 so that they are drawn deeply within narrow holes and contribute to the desired highly anisotropic etching of narrow holes in somewhat thicker layers, that is, holes with high aspect ratios. Secondly, the ions are accelerated to high energies before they strike the wafer 70. The energetic ions incident on the wafer 70 tend to sputter etch the wafer surface. In particular, the highly directional energetic ions tend to sputter etch the bottoms of the narrow holes more effectively their sidewalls.

Figure 5:
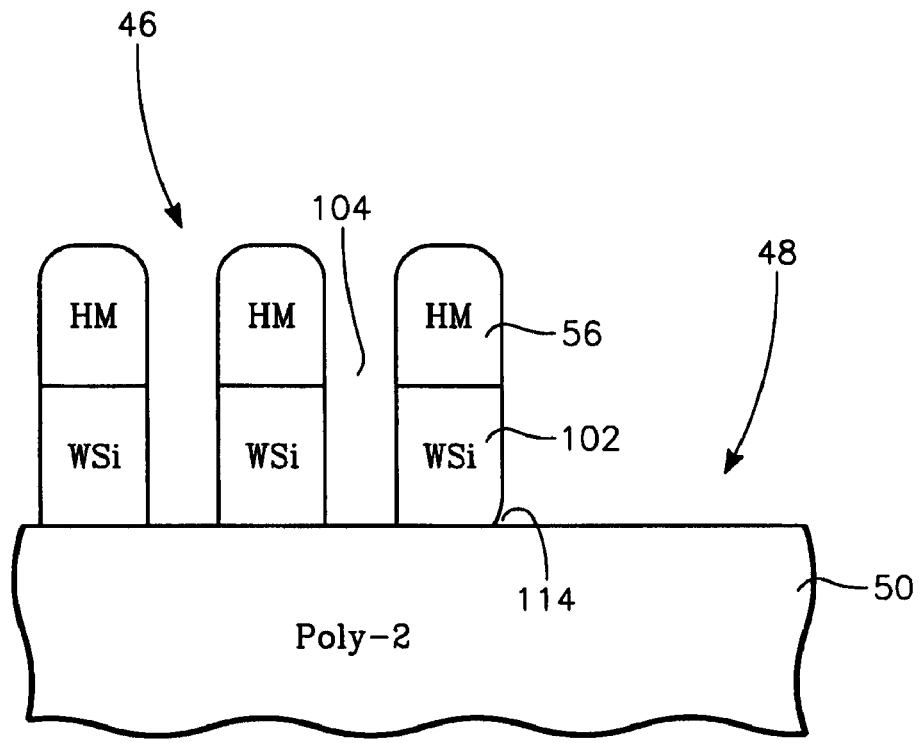
FIG. 5 is a cross-sectional view of the flash memory structure near the end of the etching of the tungsten layer.
Figure 6:
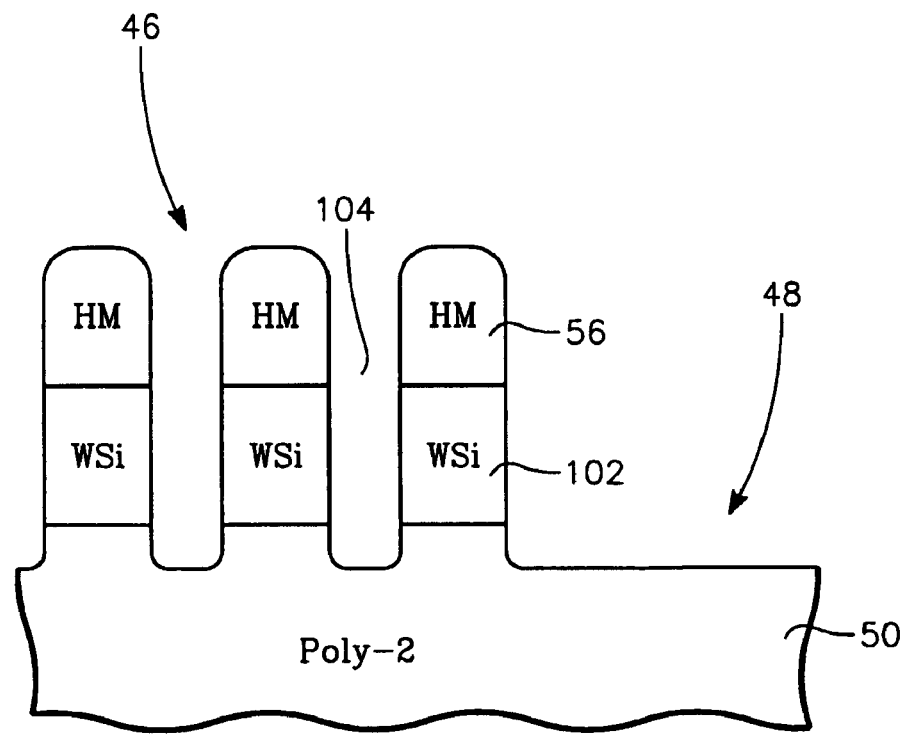
FIG. 6 is a cross-sectional view of the flash memory structure at the end of the tungsten over etch.

Many aspects of the invention are centered on the etching of the tungsten-based contact layer, particularly one having a composition of WSi. The problems of etching WSi over polysilicon become most apparent near the end of the tungsten etch, at which point the flash memory has a structure illustrated in the cross-sectional view of FIG. 5. The final etched structure at the completion of the tungsten etch is illustrated in the cross-sectional view of FIG. 6. After the hard mask layer 56 has been photolithographically defined into the hard mask 56, remnants of hard mask layer at the bottom apertures in the hard mask 56 are removed in a breakthrough step in which $CF_4$ and Ar may used as the etching gas. The main etch then etches mostly or completely through the WSi layer according to the hard mask 56 to form WSi contacts 102. As noted before, the memory cells are densely packed in the dense area 46 while no cells are formed in the iso area 48. The main etch typically removes all the WSi from the iso area 48. Although the invention is so limited, the recipes developed with the invention have been based on a conventional WSi etch chemistry based on nitrogen trifluoride ($NF_3$) and chlorine gas ($Cl_2$) from respective gas sources 106, 108 illustrated in FIG. 4 metered by respective mass flow controllers 110, 112. The inventive recipes may include supplemental gases and may specify other operating conditions.

Returning to FIG. 5, a first problem to be addressed is the microloading in which the etching becomes less effective farther into the developing narrow hole 104 between the WSi contact cells 102. Microloading has the effect of more quickly etching the WSi in the iso area 48 than at the bottom of the holes 104 in the dense area 46 and then etching the underlying polysilicon layer 50 in the iso area 48, particularly during the over etch. Some silicon etching is expected during the over etch, but if it is too large, the etch may reach the underlying ONO layer and etch it.

The microloading is reduced by using a relatively low bias power, more particularly a low ratio of bias power $W_B$ applied to the pedestal electrode 68 to the source power $W_S$ applied to the inductive coil 76. The source power $W_S$ is primarily responsible for generating the plasma while the bias power $W_B$ is primarily responsible for accelerating ions of the plasma etching gas deep within the deep gaps but also to sputter etch material at the bottom of the contact holes 104 with high selectivity to the sidewalls of the holes 104, thus producing highly anisotropic etching of the contact holes 104.

We have found that low bias power is the most effective parameter for controlling microloading. In particular, a ratio of about 6:1 in the source power $W_S$ to bias power $W_B$, for example, $W_S$=300 W and $W_B$=50 W for a 300 mm wafer, seems most effective at reducing microloading. However, at lower bias power $W_B$, bottom sidewalls 110 of the hole 104 tend to taper inwardly. If the source power is raised, for example, to 600 W, but the desired 6:1 source/bias power ratio is maintained, a better hole profile is obtained, that is, a bottom etch front is nearly flat, while the microloading remains good. These preferred power conditions may change depending upon the geometry, but source/power ratios between 4:1 and 8:1 and source power of between 400 and 800 W are expected to be advantageously used.

Another problem has been observed at a foot 114 of the outermost contact cell 102 adjacent the iso area 48. The foot 114 tends to be undercut. The addition of argon, for example, 100 sccm, to the main etch in the presence of low wafer biasing has been found to reduce the undercutting, presumably because of the reduced residence time for etch byproduct since the residence time τ may be given by $$\tau = \frac{PV}{Q},$$

where P is the chamber pressure, V is the chamber volume, and Q is the total gas flow. The reduced residence time for byproducts reduces the etch rate microloading during the tungsten main etch. Accordingly, returning to FIG. 4, argon is supplied from a gas source 116 and its flow is metered by a mass flow controller 118. Another noble gas such as helium may be substituted for argon for this purpose.

Selective etching of WSi over polysilicon is achieved by adding an oxidizing gas such as oxygen. A chlorine-based etch of WSi produces $WOCl_x$ and $SiCl_4$, both of which are volatile. As a result, the WSi overlayer is readily etched. On the other hand, applying a chlorine plasma to silicon produces $SiOCl_x$, which is not volatile. As a result, the underlying polysilicon layer is not readily etched. Accordingly, oxygen is supplied from a gas source 120 and its flow is metered by a mass flow controller 122. However, the flow of oxygen needs to be limited. The oxygen is effective at preventing etching of the polysilicon particularly in the iso area but excess oxygen results in the hole profile flaring outwardly as the WSi on the sidewalls is etched. Undercutting of the WSi layer at the dense/iso interface become particularly bad with increasing oxygen.

Nitrogen also acts as a passivating agent during the tungsten etch and acts in conjunction with the oxygen in increasing the selectivity to polysilicon. Oxygen has a major role in achieving a high selectivity of etching W/WSi over polysilicon. In the presence of chlorine gas during the W/WSi etch, additional $O_2$ produces etch byproducts of tungsten oxychloride, which is more volatile than $W_xCl_y$. However, once the etch front reacts with the polysilicon interface, the oxygen gas mainly passivates the polysilicon etch front and greatly reduces the polysilicon etch rate. On the other hand, chlorine-free etch byproducts include $Si_3N_4$, SiON, etc., which are effective in sidewall passivation. As a result, the nitrogen prevents microloading from degrading the etching profile. An optimized ratio of $O_2$ and $N_2$ in the WSi/W gate etch increases the selectivity of polysilicon while maintaining the sidewall protection by the $N_2$ component. Accordingly, nitrogen is supplied form a gas source 124 and its flow is metered by a mass flow controller 124.

A series of tests were run using both nitrogen and oxygen in both the main and overetch but no argon. Increasing the amount of oxygen in the over etch from 9 to 100 sccm produced increasing and unacceptable amount of outwardly flaring in the holes in the dense area but reduced though still significant undercutting at the iso/dense interface.

When a substantial amount of oxygen is used, it has been found that increasing the $Cl_2/NF_3$ ratio results in better poly-silicon selectivity and less undercutting at the edge of the iso area. This effect is particularly effective in the overetch. One embodiment of the invention includes a single step over etch having a recipe summarized in TABLE 1.

TABLE 1

| Parameter | Main Etch | Over Etch |
|---|---|---|
| Time (s) | 22.2 | 14 |
| Pressure (milliTorr) | 4.5 | 4 |
| Source Power (W) | 600 | 750 |
| Bias Power (W) | 75 | 185 |
| $NF_3$ Flow (sccm) | 40 | 7 |
| $Cl_2$ Flow (sccm) | 50 | 80 |
| $N_2$ Flow (sccm) | 150 | 200 |
| $O_2$ Flow (sccm) | 18 | 15 |
| Ar Flow (sccm) | 100 | 0 |

During the main etch, 25% more $Cl_2$ than $NF_3$ is supplied. Selectivity to polysilicon is achieved by supplying both oxygen and eight times more of nitrogen. Undercutting is prevented by supplying argon. During the single over etch step, the flow of $NF_3$ is substantially reduced, for example, by at least a factor of two and preferably at least four, while the flow of $Cl_2$ is somewhat increased. The combination of a high $Cl_2/NF_3$ ratio, for example, between 5 and 25, and substantial oxygen, for example, greater than the flow of $NF_3$, Also in the over etch step, little if any argon is supplied and the flow of oxygen is somewhat reduced while the flow of nitrogen is increased. Beginning with 90 nm of WSi and 40 nm of polysilicon with mask openings of 100 nm, the above recipe was observed to leave 22 nm of polysilicon in the dense area and 20 nm in the iso area. There was no significant undercutting at the edge of the iso area. The WSi hole showed good profile though with some inward tapering.

With the large number of effects requiring control and optimizing, it has been found that a two-step over etch, that is, a three-step tungsten etch can provide superior results. In the first over etch step, a high oxygen supply shuts down the polysilicon etch, thus providing a high WSi/Si selectivity. The high amount of oxygen also eliminates the WSi depth loading but is believed responsible for the foot that develops at the bottom of WSi layer at the dense/iso interface due to the oxidation of the WSi. However, in the second over etch step, the flow of oxygen is significantly reduced while the bias power is significantly increased although the source power is somewhat decreased. The increased bias power is effective at removing the small WSi foot at the iso/dense interface and produce a more rectangular profile in the polysilicon at the bottom of the holes. A exemplary recipe for the two-step over etch process is summarized in TABLE 2.

TABLE 2

| Parameter | Main Etch | Over Etch 1 | Over Etch 2 |
|---|---|---|---|
| Time (s) | 12 | 10 | 15 |
| Pressure (milliTorr) | 4.5 | 4.5 | 8 |
| Source Power (W) | 600 | 600 | 500 |
| Bias Power (W) | 100 | 115 | 240 |
| $NF_3$ Flow (sccm) | 40 | 20 | 20 |
| $Cl_2$ Flow (sccm) | 50 | 25 | 25 |
| $N_2$ Flow (sccm) | 180 | 350 | 500 |
| $O_2$ Flow (sccm) | 0 | 60 | 7 |
| Ar Flow (sccm) | 100 | 0 | 0 |

This recipe was tested on the previously described flash memory structure. The profiles in the dense area were very vertical even into the polysilicon. Some undercutting was observed at the iso/dense interface and some flaring on the sides of wider trenches.

The undercutting may also be controlled by the addition of use of a silo-chloro passivating gas, for example, silicon tetrachloride ($SiCl_4$), containing both silicon and chlorine supplied from a gas source 128 with its flow metered by a mass flow controller 130. The silo-chloro gas effectively prevents etching of the polysilicon exposed early in the iso area and protects the WSi sidewalls. Silicon tetrachloride with a melting point of $-70°$ C. and a boiling point of $57.57°$ C. is known to be used as a silicon deposition gas useful for chamber seasoning. The addition of 10 to 20 sccm of $SiCl_4$ to the over etch in the above recipes has been observed to effectively eliminate the undercutting at the iso/dense interface. However, even 10 sccm produces some outward flaring of the sides and rounding of the bottoms of the holes in the dense area, resulting in WSi feet above the polysilicon. It also produces a somewhat outward slope of the WSi at the iso/dense interface. At 30 sccm, the flaring, rounding, and WSi feet become severe and results in an obvious WSi tail into the iso area.

It has further been found that the ratio $NF_3SiCl_4$ of the flows of nitrogen trifluoride to silicon tetrachloride can be chosen to improve the profiles in both the dense area and the iso area, that is, at the iso/dense interface. Increasing the ratio $NF_3SiCl_4$ to above 1 reduces the rounding initially experienced with adding $SiCl_4$. A ratio of 3 shows very good results with the very rectangular profiles and thicknesses of polysilicon remaining in the dense and isolated areas being 20 nm and 21 nm respectively. Hence, advantageous results are expected at ratios between 2 and 5.

The use of a silo-chloro gas demonstrates that the microloading can be controlled by the silo-chloro/nitrogen trifluoride ratio and it is possible to achieve reverse micro-loading by increasing the flow of the nitrogen trifluoride relative to the silo-chloro gas since the silo-chloro gas is so effective at passivating the polysilicon etching in the iso area.

Following the completion of the tungsten etching process, conventional etching processes may be used to remove the upper polysilicon layer 50 down to the underlying oxide in order to achieve the flash memory structure of FIG. 1. Conventional techniques are used to electrically contact the WSi contact layer 30 and the source and drain regions 16, 18.

The invention can be applied to other structures than WSi overlying polysilicon. For example, other tungsten-containing contact layers include substantially pure tungsten and tungsten nitride. However, the common silicon content of WSi and polysilicon presents the difficult combination of materials where etching selectivity is required.

It is understood that the crystallinity of the polysilicon layer is not required for use of the invention. Also, the silicon layer may contain dopants and other impurities up to 5 at %. It is further understood that a tungsten-containing material comprises at least 10 at % tungsten, preferably at least 90 at % tungsten for a tungsten layer and that a tungsten silicide material comprises at least 10 at % of silicon.

Although the invention has been developed in a plasma etch chamber utilizing a inductive plasma source, it may be practiced in other types of plasma etch chambers, for example, ones having a capacitive plasma source, for example, a showerhead electrode powered by an RF or VHF electrical source and disposed in opposition to the wafer and supplying the etching gas through the showerhead.

The invention thus satisfies a large number of competing requirements in the etching of a complex structure having layers requiring differential etching but having somewhat similar compositions.

The invention claimed is:

1. A method of etching a tungsten-containing layer overlying a silicon layer, comprising the steps of:
   placing onto an electrode in a plasma reaction chamber a substrate containing the tungsten-containing layer and an etching mask overlying the tungsten-containing layer, wherein the silicon layer consists principally of silicon;
   a first step of flowing into the chamber a first gas mixture comprising an etching gas comprising $NF_3$ and $Cl_2$ and an oxidizing gas comprising oxygen gas and nitrogen gas;
   biasing the electrode with a first level of RF power;
   applying a second level of RF power to excite the first gas mixture into a first plasma to thereby etch at least the tungsten-containing layer sufficiently that at least some of the silicon layer is exposed;
   a subsequent second step of flowing into the chamber a second gas mixture comprising the etching gas having a smaller fraction of $NF_3$ than in the first step and the oxidizing gas having a larger fraction of nitrogen gas than in the first step;
   biasing the electrode with a third level of RF power greater than the first level; and
   applying a fourth level of RF power to excite the second gas mixture into a second plasma to thereby etch possibly remaining portions of the tungsten-containing layer remaining before the second gas mixture had been excited into the second plasma.

2. The method of claim 1, wherein the first step further comprises flowing a noble gas selected from the group consisting of helium and argon into the chamber.

3. The method of claim 1, wherein a ratio of the nitrogen gas to the oxygen gas is at least 4.

4. The method of claim 1, wherein a ratio of the fourth level to the third level of RF powers is between 4 and 8.

5. The method of claim 1, further comprising the steps of:
   a subsequent third step of flowing a third gas mixture into the chamber comprising the etching gas and the oxidizing gas, wherein a ratio of the nitrogen gas to the oxygen gas is greater than in the second step;
   biasing the electrode with a fifth level of RF power less than the third level; and
   applying a sixth level of RF power to excite the third gas into a plasma.

6. The method of claim 1, wherein the first gas mixture additionally comprises a passivating gas comprising silicon and chlorine constituents.

7. The method of claim 1, wherein the tungsten-containing layer and the silicon layer are included in a flash memory structure including an ONO layer comprising a first oxide layer, a nitride layer, and a second oxide layer overlying a gate structure formed in a silicon substrate.

8. The method of claim 1, wherein a ratio of the second level to the first level is between 4 and 8.

9. The method of claim 1, wherein the second gas mixture additionally comprises a passivating gas comprising silicon and chlorine constituents.

10. The method of claim 9, wherein the passivating gas comprises silicon tetrachloride.

11. A method of etching a tungsten-containing layer overlying a silicon layer, comprising the steps of:
    placing onto an electrode in a plasma reaction chamber a substrate containing the tungsten-containing layer and an etching mask overlying the tungsten-containing layer, wherein the silicon layer consists principally of silicon;

a first step of flowing into the chamber a first gas mixture comprising an etching gas comprising chorine and fluorine, an oxidizing gas comprising oxygen gas and nitrogen gas, and a passivating gas comprising silicon tetrachloride;

biasing the electrode with a first level of RF power;

applying a second level of RF power to excite the first gas mixture into a plasma to thereby selectively etch relative to the silicon layer at least the tungsten-containing layer sufficiently that at least some of the silicon layer is exposed.

12. The method of claim 11, wherein a ratio of the second level to the first level is between 4 and 8.

13. A method of etching a tungsten-containing layer comprising tungsten and silicon and overlying a silicon layer, comprising the steps of:

placing within a plasma reaction chamber a substrate containing the tungsten-containing layer;

flowing into the plasma reaction chamber a first gas mixture comprising an etching gas comprising a chlorine- and fluorine-containing gas and a passivating gas comprising a silo-chloro compound; and exciting the first gas mixture into a plasma to thereby etch the tungsten-containing layer selectively to the silicon layer.

14. The method of claim 13, wherein the silo-chloro compound comprises silicon tetrachloride.

15. The method of claim 13, wherein the chlorine- and fluorine-containing gas comprises nitrogen trifluoride and chlorine gas.

16. The method of claim 13, wherein the first gas mixture further includes a gas chosen from the group consisting of oxygen gas and nitrogen gas.

17. The method of claim 13, wherein the exciting step includes applying RF power to an inductive coil associated with the chamber and further including supplying RF power through a capacitive coupling circuit to an electrode supporting the substrate.

18. A multi-step method of etching tungsten silicide over silicon, comprising the steps of:

placing a substrate containing a tungsten silicide layer overlying a silicon layer onto an electrode in a plasma reaction chamber;

a first flowing step of flowing into the plasma reaction chamber a first gas mixture comprising an etching gas comprising nitrogen trifluoride and chlorine gas, an oxidizing gas comprising oxygen gas and nitrogen gas, and argon;

a first exciting step of exciting the first gas mixture into a first plasma to etch through the tungsten silicide layer in at least a portion of the substrate while biasing the electrode with a first level of RF power;

a second flowing step of flowing into the plasma reaction chamber a second gas mixture comprising the etching gas and the oxidizing gas while biasing the electrode with a second level of RF power lower than the first level; and a second exciting step of exciting the second gas mixture into a second plasma while biasing the electrode with a second level of RF power lower than the first level to etch possibly remaining portions of the tungsten silicide layer remaining at the conclusion of the first flowing step.

19. The method of claim 18, wherein less nitrogen trifluoride is flowed into the chamber in the second step than in the first step.

20. A method of etching a tungsten silicide layer, comprising the steps of:

placing within a plasma reaction chamber a substrate containing a tungsten silicide layer;

flowing into the plasma reaction chamber a first gas mixture comprising an etching gas comprising a chlorine- and fluorine-containing gas and a passivating gas comprising constituents including silicon and chlorine; and exciting the first gas mixture into a plasma to thereby etch the tungsten silicide layer.

21. The method of claim 20, wherein the passivating gas comprises silicon tetrachloride.

22. The method of claim 20, wherein the etching gas comprises nitrogen trifluoride and chlorine gas.

23. The method of claim 20, wherein the first gas mixture further includes a gas chosen from the group consisting of oxygen gas and nitrogen gas.

24. The method of claim 20, wherein the exciting step includes applying RF power to an inductive coil associated with the chamber and further including supplying RF power through a capacitive coupling circuit to a pedestal electrode supporting the substrate.

25. A multi-step method of etching tungsten silicide over silicon, comprising the steps of:

placing a substrate containing a tungsten silicide layer of tungsten overlying a silicon layer onto a pedestal electrode in a plasma reaction chamber;

a first step of flowing into the plasma reaction chamber a first gas mixture comprising an etching gas comprising nitrogen trifluoride and chlorine gas, a first gas comprising oxygen gas and nitrogen gas, and argon;

exciting the first gas mixture into a first plasma to etch through the tungsten silicide layer in at least a portion of the substrate while biasing the pedestal electrode with a first level of RF power;

a subsequent second step of flowing into the plasma reaction chamber a second gas mixture comprising the etching gas, the first gas, and a passivating gas comprising constituents including silicon and chlorine and exciting the second gas mixture into a second plasma while biasing the pedestal electrode with a second level of RF power greater than the first level to thereby etch possibly remaining portions of the tungsten silicide layer remaining before the second gas mixture had been excited into the second plasma.

26. The method of claim 25, wherein the step of exciting the first gas mixture includes applying RF power to an inductive coil associated with the chamber.

27. The method of claim 25, wherein the passivating gas comprises silicon tetrachloride.

28. A method of etching a tungsten-containing layer overlying a silicon layer, comprising the steps of:

placing onto a pedestal electrode in a plasma reaction chamber a substrate containing the tungsten-containing layer, the silicon layer, and an etching mask overlying the tungsten-containing layer, wherein the silicon layer consists principally of silicon;

a first step of flowing into the chamber a first gas mixture comprising a first gas comprising chlorine and $NF_3$ and a second gas comprising oxygen gas and nitrogen gas;

biasing the pedestal electrode with a first level of RF power;

applying a second level of RF power to excite the first gas mixture into a first plasma to thereby etch at least the tungsten-containing layer sufficiently that at least some of the silicon layer is exposed, wherein a ratio of the second level to the first level is between 4 and 8;

a subsequent second step of flowing into the chamber a second gas mixture comprising the first gas having a smaller fraction of $NF_3$ than in the first step, the second gas having a larger fraction of nitrogen gas than in the first step, and a passivating gas comprising silicon and chlorine constituents;

biasing the pedestal electrode with a third level of RF power greater than the first level; and applying a fourth level of RF power to excite the second gas mixture into a second plasma to thereby etch possibly remaining portions of the tungsten-containing layer remaining before the second gas mixture had been excited into the second plasma.

29. The method of claim 28, wherein the passivating gas comprises silicon tetrachloride.

30. The method of claim 28, wherein the first step further comprises flowing a noble gas selected from the group consisting of helium and argon into the chamber.

31. The method of claim 28, wherein a ratio of the nitrogen gas to the oxygen gas in the first step is at least 4.

32. The method of claim 28, wherein the second level of RF power is applied to an inductive coil associated with the chamber.

33. The method of claim 28, wherein a ratio of the fourth level to the third level of RF powers is between 4 and 8.

34. The method of claim 28, further comprising the steps of:

a subsequent third step of flowing a third gas mixture into the chamber comprising the first gas and the second gas, wherein a ratio of the nitrogen gas to the oxygen gas is greater in the third step than in the second step;

biasing the pedestal electrode with a fifth level of RF power less than the third level; and applying a sixth level of RF power to excite the third gas mixture into a plasma.

35. The method of claim 28, wherein during the second step the plasma of the second gas mixture acts on exposed portions of the silicon layer and etches any remaining portions of the tungsten-containing layer.

* * * * *